(12) United States Patent
Ojala et al.

(10) Patent No.: US 8,810,981 B2
(45) Date of Patent: Aug. 19, 2014

(54) SEQUENTIAL ELECTROSTATIC DISCHARGE (ESD)-PROTECTION EMPLOYING CASCODE NMOS TRIGGERED STRUCTURE

(75) Inventors: Pekka Kalervo Ojala, Fremont, CA (US); Shi-Ping Fan, Milpitas, CA (US)

(73) Assignee: Exar Corporation, Fremont, CA (US)

( * ) Notice: Subject to any disclaimer, the term of this patent is extended or adjusted under 35 U.S.C. 154(b) by 16 days.

(21) Appl. No.: 13/538,361

(22) Filed: Jun. 29, 2012

(65) Prior Publication Data
US 2013/0155557 A1 Jun. 20, 2013

Related U.S. Application Data

(60) Provisional application No. 61/504,025, filed on Jul. 1, 2011.

(51) Int. Cl.
H02H 3/22 (2006.01)
H02H 9/04 (2006.01)
H02H 3/20 (2006.01)
H01L 27/02 (2006.01)

(52) U.S. Cl.
CPC ............ *H02H 3/20* (2013.01); *H02H 9/046* (2013.01); *H01L 27/0285* (2013.01)
USPC ............................................. 361/56; 361/111

(58) Field of Classification Search
USPC ...................................................... 361/56, 111
See application file for complete search history.

(56) References Cited

U.S. PATENT DOCUMENTS 7,224,560 B2 * 5/2007 May et al. ................ 361/56
7,924,539 B2 * 4/2011 Ishizuka et al. .......... 361/56

* cited by examiner

*Primary Examiner* — Danny Nguyen
(74) *Attorney, Agent, or Firm* — Kilpatrick Townsend & Stockton LLP

(57) ABSTRACT

An Electrostatic Discharge (ESD) protection circuitry comprises a protection device structure. The protection device structure includes at least one transistor with a gate operably connected to a pad. The at least one transistor turns on upon an ESD event and conducting charge to a substrate. At least one additional transistor with a gate operably connected to the substrate turns on after the at least one transistor upon an ESD protection event.

6 Claims, 6 Drawing Sheets

Silicide Block

SEQUENTIAL ELECTROSTATIC DISCHARGE (ESD)-PROTECTION EMPLOYING CASCODE NMOS TRIGGERED STRUCTURE

FIELD OF INVENTION

The present invention relates to electrostatic discharge (ESD) protection circuitry.

BACKGROUND

Electrostatic discharge (ESD) is the sudden and momentary electric current between two objects at different electrical potentials. A common cause of ESD events is static electricity from humans who contact an object which is at a different electric potential or equipments that collect charge during operation. Such ESD events can permanently damage integrated circuit (IC) chips if they are not protected by ESD protection circuitry.

High-level electrostatic discharge (ESD) stress protection typically requires a large area for the protection device on the product layout. For high-speed circuits that cannot tolerate large capacitive loading, alternative techniques are required. Further, as the reduction of device dimensions in advanced deep sub-micron process technologies make them more sensitive to the ESD-stress, function of ESD protection becomes more challenging.

SUMMARY

Embodiments of the present invention entail ESD protection circuits for human body model (HBM) and system level ESD events with protection elements that are designed to turn on sequentially within one protection device structure by high-level ESD-stress current in the first element that triggers the sequential device element with optimum timing and I-V-characteristics, and with sequence of ground isolated circuit structures to provide protection against initial high-level ESD stress that is reduced to lower level residual stress with the sequence of protection circuits.

By turning on the ESD protection elements sequentially the core circuitry is better shielded from the voltage stress at the pad. The optional series impedance path between the sequential protection structures effectively further reduces the residual voltage stress level that reaches the core circuitry.

DETAILED DESCRIPTION

Figure 1:
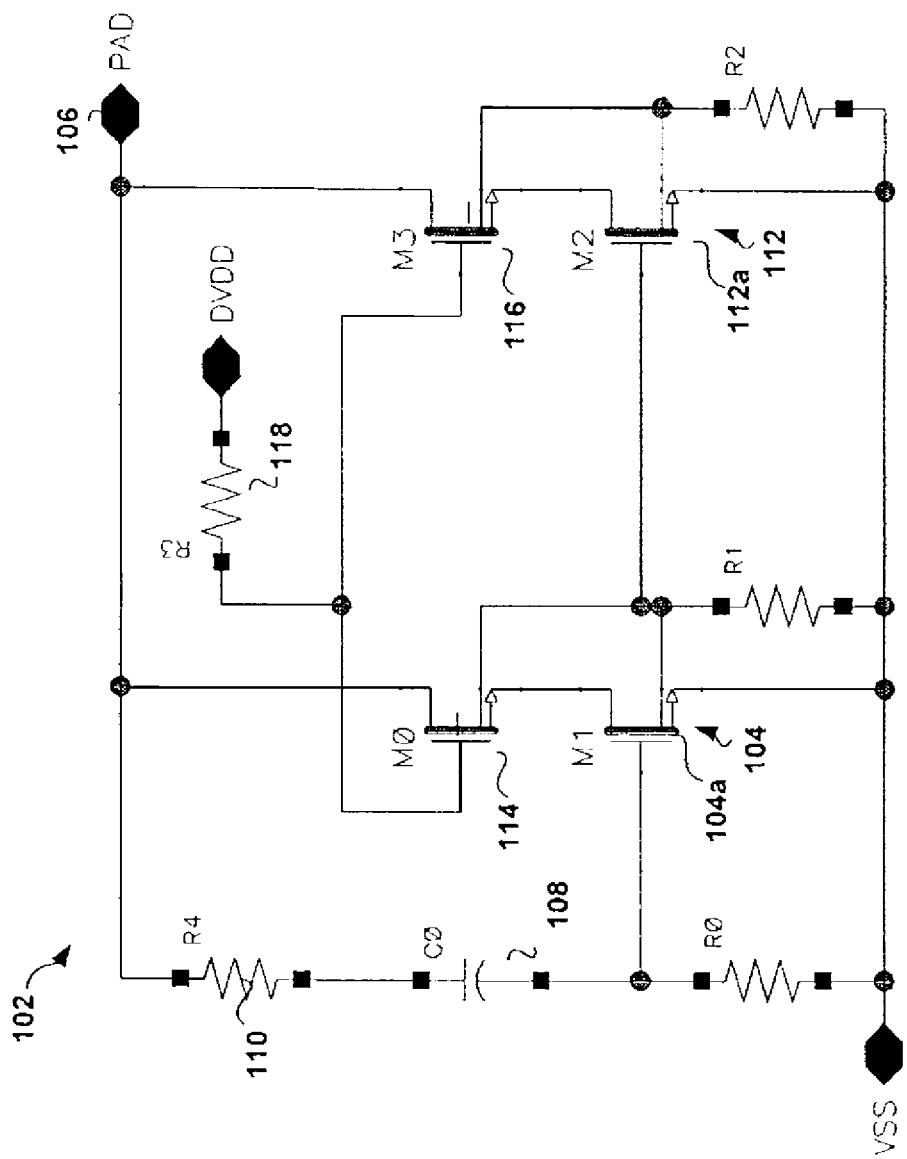
FIG. 1 shows an ESD-protection circuitry for sequentially triggering device elements within the self-contained high ESD-stress protection structure.

FIG. 1 shows a protection device structure 102 of one embodiment of the present invention. The protection device structure 102 includes at least one transistor 104 with a gate 104a operably connected to a pad 106. In one embodiment, the gate 104a is connected through capacitive element 108 and resistor 110 to the Pad 106. The transistor 104 providing a parasitic NPN structure from drain to source that turns on upon an ESD event conducting charge to the substrate.

At least one additional transistor 112 has a gate 112a connected to the ESD-ground via resistive substrate connection to conduct additional charge from the ESD event to the substrate. The additional transistor 112 will turn on after the transistor 104. Since the transistor 112 is not operably connected to the pad, the transistor 112 does not add capacitance as seen by the pad. This is important when high frequencies are used in the chip.

Multiple parallel transistors can be used for the at least one transistor 104 and for the at least one transistor 112. In the present invention shown in FIG. 1, there are two of the at least one transistors 104 and twenty of the at least one additional transistors 112 in parallel. Keeping the number of the at least one transistors 104 lower than the number of the at least one additional transistors 112 helps keep the capacitance seen by the pad 106 relatively low.

The at least one transistor 104 and at least one additional transistor 112 are connected optionally to transistors 114 and 116 forming cascoded configuration to provide higher trigger voltage and holding voltage for ESD-current. These transistors 114 and 116 have their gates operably connected through resistance element 118 to a supply voltage (DVDD). The resistive element 118 can be a metal-oxide-semiconductor field-effect transistor (MOSFET) effective resistance.

Figure 6:
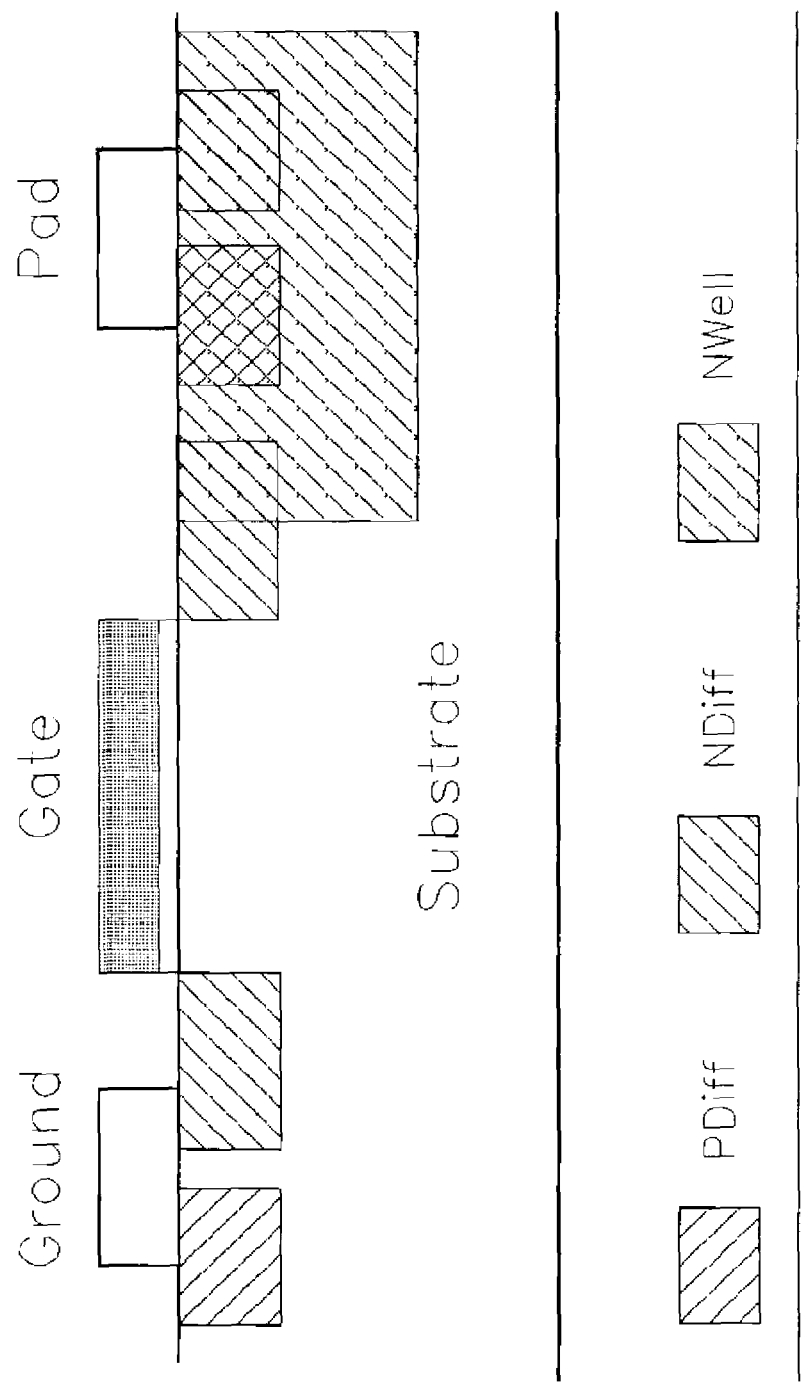
FIG. 6 shows optional parasitic low trigger voltage silicon controlled rectifier (LVT SCR) structures.

FIG. 6 shows optional parasitic low trigger voltage silicon controlled rectifier (LVT SCR) structures that can be implemented with additional N-well layout features in devices 114 and 116.

Figure 2:
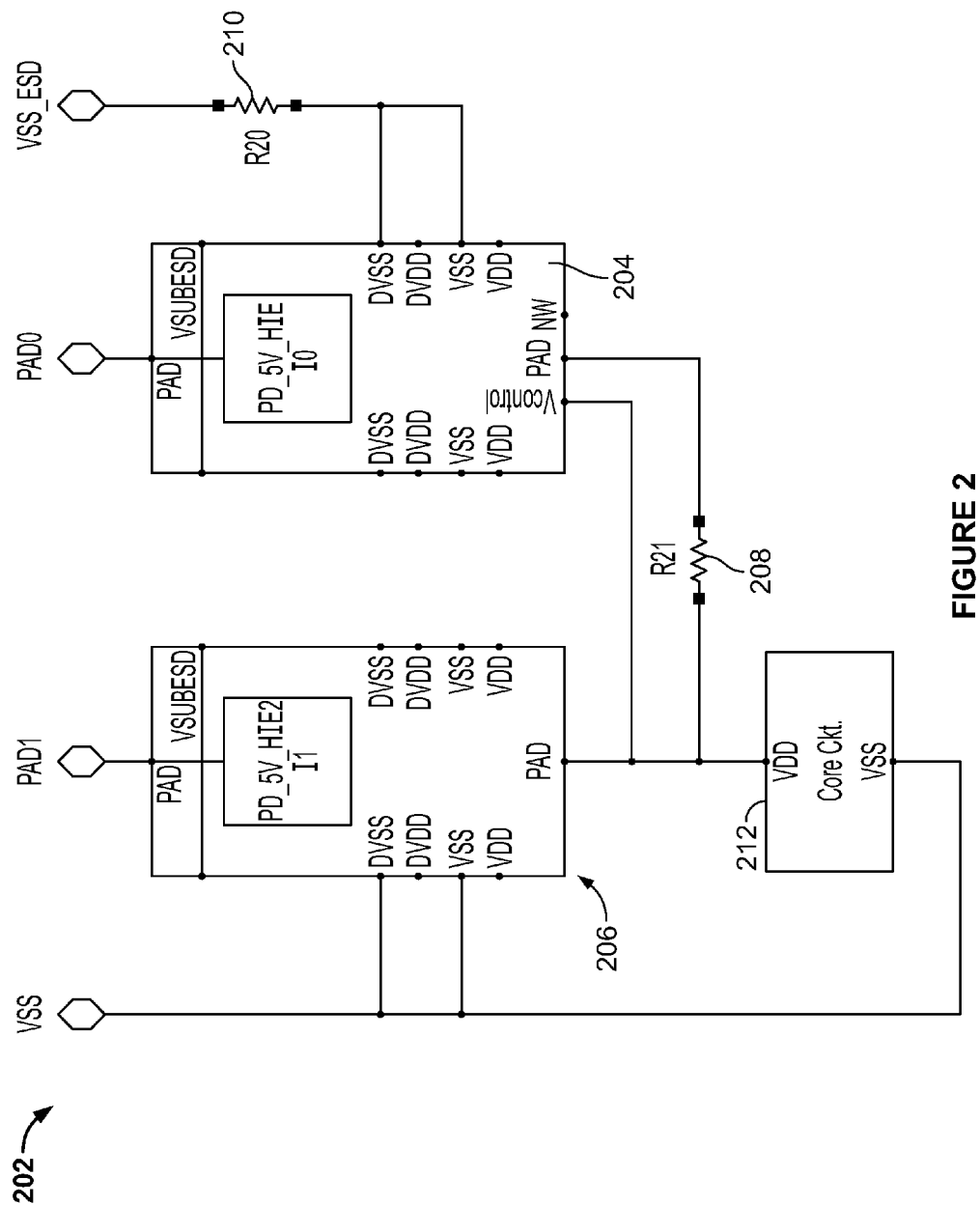
FIG. 2 shows an ESD-protection circuitry for sequentially turning on separate circuit structures.
Figure 3:
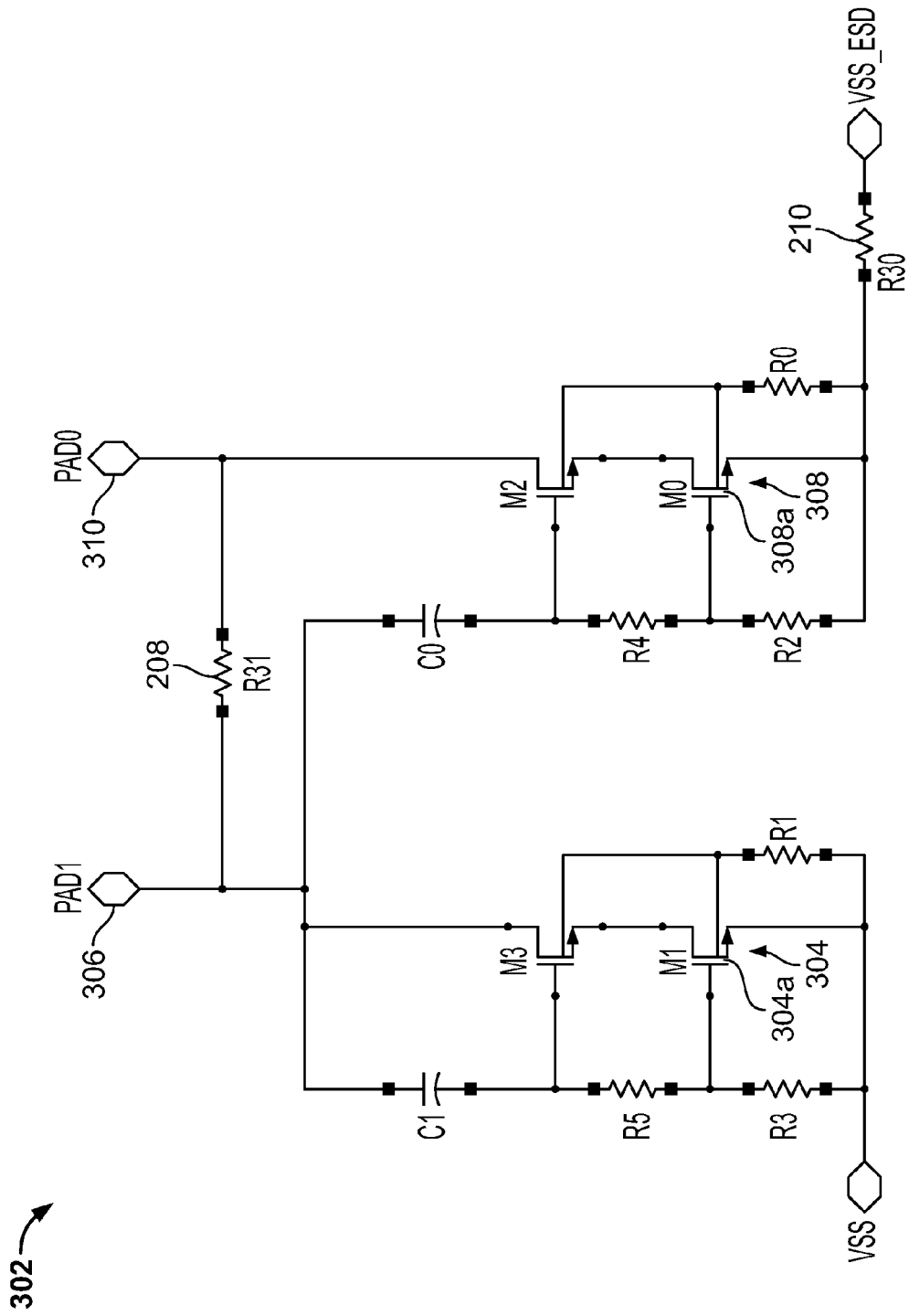
FIG. 3 shows new ESD-protection circuitry for sequentially turning on circuits within the individual protection cells.

The sequence of ground isolated protection circuits is shown in ESD protection circuit 202 of FIG. 2. The protection device structure 206 can be as shown in FIG. 3. The ESD protection device structure 206 is connected through resistor 208. Resistor 210 (R30 in FIG. 3.) is the undesirable metal resistance along the path to VSS_ESD PAD. The resistance of 210 is minimized by proper metal line sizing.

Circuitry 212 is protected by the ESD protection circuit 202. In the invention of FIG. 2, the circuitry 212 is a core circuit, which represents any type of circuitry to be protected.

An ESD protection device structure 302 in FIG. 3 shows circuit details of devices 204 and 206 in FIG. 2. Transistor 304 has a gate 304a operably connected to PAD 306 to dissipate charge from PAD 306 that includes structure 206 of circuit 202. Transistor 308 has a gate 308a operably connected to PAD 306 to dissipate charge present at PAD 310 during ESD event. PAD 310 includes structure 204 of circuit 202. The PAD 306 is not necessarily wire bonded out to package pin.

Figure 4:
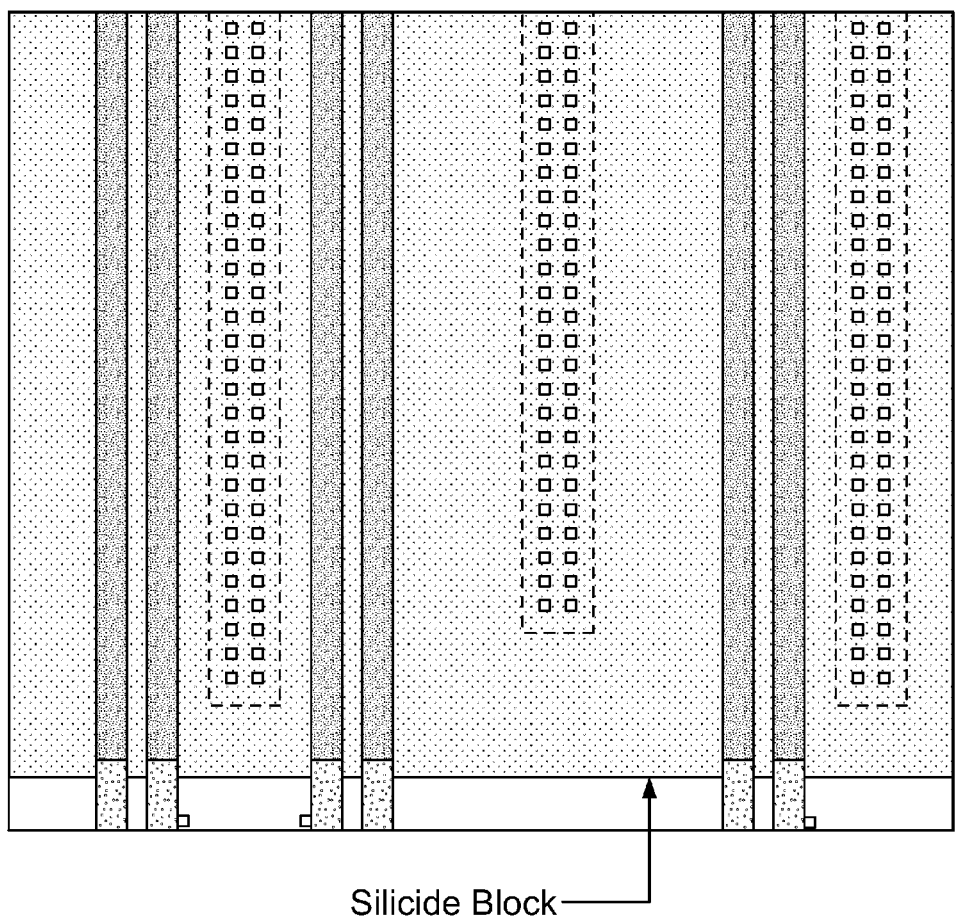
FIG. 4 is an exemplary layout implementation of the new ESD-protection of cascoded N-channel metal-oxide semiconductor (NMOS) structures.

FIG. 4 is shows a sample layout implementation of the new ESD-protection of cascoded NMOS structures leaving only the contact areas silicided by the use of silicide blocks in surrounding areas.

Figure 5:
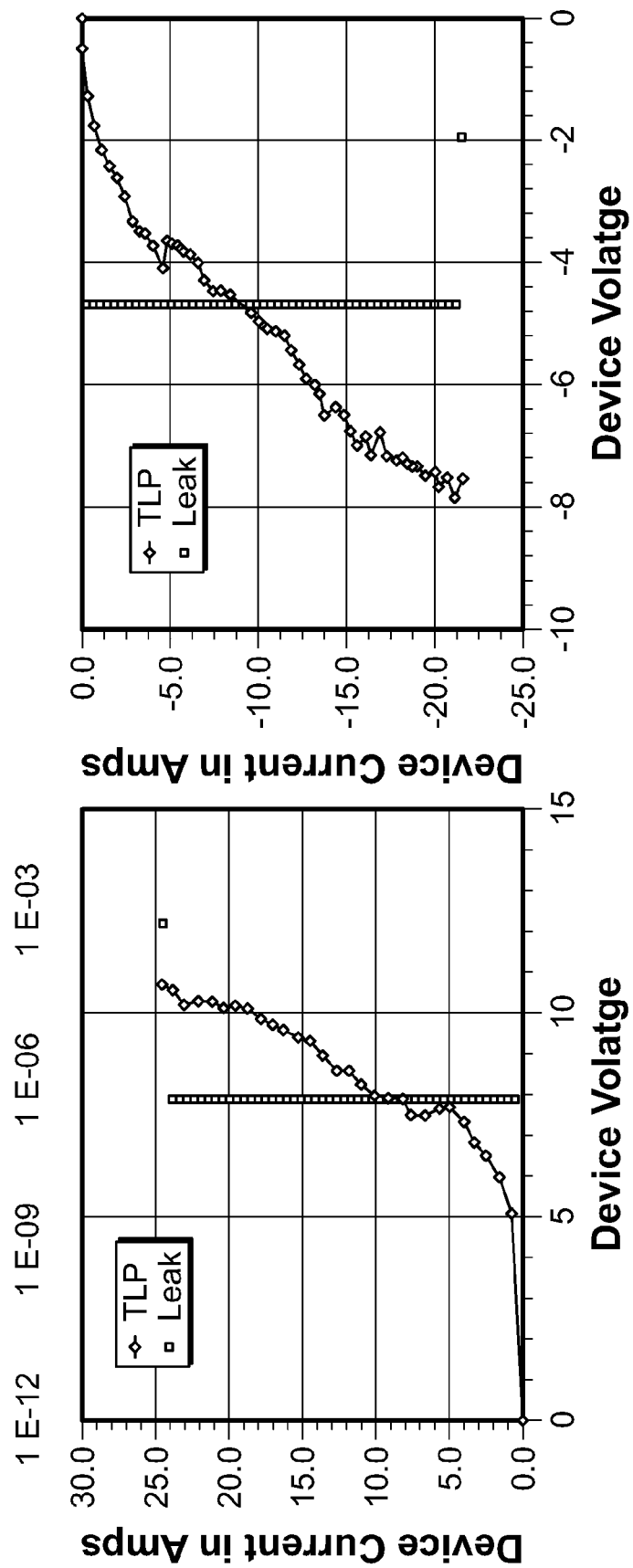
FIG. 5 shows new ESD-protection cascode circuitry current/voltage (I-V) characteristics from Transmission Line Pulse (TLP) measurement of pin to ground or ground-to-pin.

FIG. 5 shows new ESD-protection cascode circuitry current/voltage (I-V) characteristics from transmission line pulse (TLP) measurement of pin to GND or GND to pin.

Embodiments of the present invention have the following features:
1. Adjacent 5V tolerant cascode elements that are turned on by high level substrate pumping current that is designed to go through the substrate area of the capacitive coupled cascode.

2. Silicidation block at the Drain of the top NMOS and Source of the bottom NMOS with special arrangements of contacts.
3. Above mentioned cascode elements are multiplied to form large number of parallel current paths without joining the nets between the NMOS devices.
4. Optional layout features to form silicon controlled rectifier (SCR) structure across the cascoded NMOS devices at high current level.
5. The 5V tolerant NMOS ESD protection structure that is turned on to conduct when high voltage level is present at the gates of NMOS devices through capacitive coupling from the node which is an internal non-bonded out pad separated by a resistor from the pad connected to package pin.
6. Resistor between the primary stage ESD protection structures (to VSS_ESD) and core circuitry.
7. A secondary stage ESD protection structure (to VSS) is connected to the core side of the above-mentioned resistor.
8. Optional pass-transistors in core area to drop ESD stress voltage level lower.

In the new circuit implantation, ESD protection is achieved with the separate ESD protection elements conducting in parallel sequentially at different time and voltage level. These characteristics of the circuit enable the first device to conduct before the parallel paths to add to the overall current path at higher level of voltage stress. The turn-on level can be tuned for optimal current levels with proper choice of protection devices, their holding voltages and series resistances. The sequential nature of the protection can also be tuned to protect the core during an entire ESD stress event. The SCR activity triggered by the NMOS devices occurs at high current level if implemented in layout.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. An Electrostatic Discharge (ESD) protection circuitry comprising:
   a protection device structure including:
      at least one transistor with a gate operably connected to a pad, the at least one transistor turning on in response to an ESD event and conducting charge to a substrate; and
      at least one additional transistor with a gate operably connected to the substrate,
      wherein the at least one additional transistor is configured to turn on after the at least one transistor in response to the ESD event,
      wherein the at least one transistor and at least one additional transistor are operably further connected to transistors in a cascode configuration and comprising gates connected to a supply voltage.

2. The ESD protection circuitry of claim 1, wherein the protection device structure includes multiple at least one transistors.

3. The ESD protection circuitry of claim 1, wherein the protection device structure includes multiple at least one additional transistors.

4. The ESD protection circuitry of claim 1, wherein the protection device structure includes more of the at least one additional transistors than the at least one transistors.

5. The ESD protection circuitry of claim 1, further comprising additional protection device structures.

6. The ESD protection circuitry of claim 5, wherein the protection device structure is connected to another protection device structure using a resistor.

* * * * *